United States Patent
Ro et al.

(10) Patent No.: US 9,472,577 B2
(45) Date of Patent: Oct. 18, 2016

(54) THIN FILM TRANSISTOR SUBSTRATE, DISPLAY APPARATUS HAVING THE SAME, AND MANUFACTURING METHOD THEREOF

(71) Applicant: Samsung Display Co., Ltd., Yongin, Gyeonggi-Do (KR)

(72) Inventors: Sungin Ro, Hwaseong-si (KR); Eunje Jang, Hwaseong-si (KR); Younggu Kang, Hwaseong-si (KR); HyunWuk Kim, Yongin-si (KR); Ock Soo Son, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 55 days.

(21) Appl. No.: 14/262,765

(22) Filed: Apr. 27, 2014

(65) Prior Publication Data
US 2015/0123112 A1 May 7, 2015

(30) Foreign Application Priority Data
Nov. 7, 2013 (KR) .................. 10-2013-0134977

(51) Int. Cl.
 H01L 29/04 (2006.01)
 H01L 27/12 (2006.01)
(52) U.S. Cl.
 CPC ....... H01L 27/1225 (2013.01); H01L 27/1248 (2013.01)
(58) Field of Classification Search
 CPC ........... H01L 27/1214; H01L 27/1251; H01L 27/3244–27/3297; H01L 29/4908; H01L 51/0508–51/0533; H01L 2924/13069; H01L 29/41733; H01L 29/42384; H01L 29/66265; H01L 29/66742–29/6675; H01L 29/7317; H01L 29/786; H01L 27/127
 See application file for complete search history.

(56) References Cited

U.S. PATENT DOCUMENTS

| | | | |
|---|---|---|---|
| 5,818,550 A * | 10/1998 | Kadota | G02F 1/133514 349/106 |
| 7,180,559 B2 * | 2/2007 | Chang et al. | 349/106 |
| 7,612,860 B2 | 11/2009 | Kim et al. | |
| 7,858,452 B2 | 12/2010 | Park | |
| 8,253,890 B2 | 8/2012 | Zhong et al. | |
| 8,253,891 B2 | 8/2012 | Yu et al. | |
| 2006/0290829 A1 | 12/2006 | Kim | |
| 2008/0030833 A1 * | 2/2008 | Park | 359/259 |
| 2009/0090915 A1 * | 4/2009 | Yamazaki et al. | 257/66 |
| 2009/0303422 A1 | 12/2009 | Kim et al. | |
| 2011/0180798 A1 | 7/2011 | Shim et al. | |
| 2011/0249228 A1 * | 10/2011 | Kubota et al. | 349/140 |
| 2012/0061663 A1 * | 3/2012 | Yamazaki | H01L 21/02488 257/43 |
| 2014/0104527 A1 * | 4/2014 | Yang | H01L 27/1225 349/43 |
| 2015/0001526 A1 * | 1/2015 | Huang | H01L 29/45 257/43 |

FOREIGN PATENT DOCUMENTS

| | | |
|---|---|---|
| KR | 1020110040222 A | 4/2011 |
| KR | 1020110064272 A | 6/2011 |
| KR | 1020150070647 A | 6/2015 |

* cited by examiner

Primary Examiner — Cuong B Nguyen
(74) Attorney, Agent, or Firm — Cantor Colburn LLP

(57) ABSTRACT

Each pixel of a thin film transistor substrate includes a base substrate including a pixel display area and a pixel non-display area surrounding the pixel display area, a gate electrode on the base substrate in the pixel non-display area, a first insulating layer which is on the base substrate in the pixel non-display area and covers the gate electrode, a semiconductor layer on the first insulating layer, of which a predetermined portion thereof overlaps the gate electrode, a source electrode and a drain electrode which are spaced apart from each other and on the semiconductor layer, a second insulating layer which is on the first insulating layer and the base substrate and covers the source electrode and the drain electrode, and a pixel electrode on the second insulating layer in the pixel display area.

15 Claims, 12 Drawing Sheets

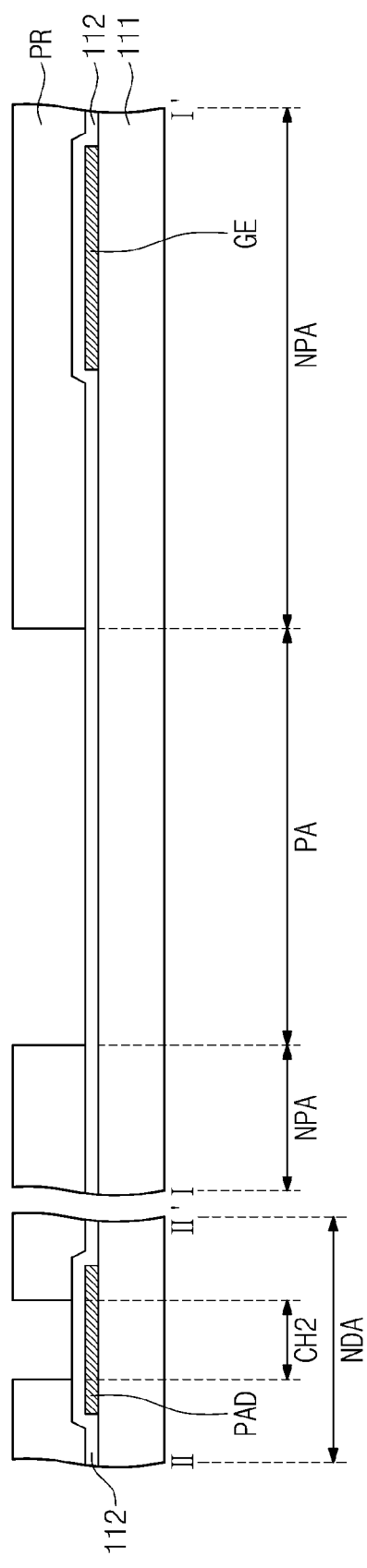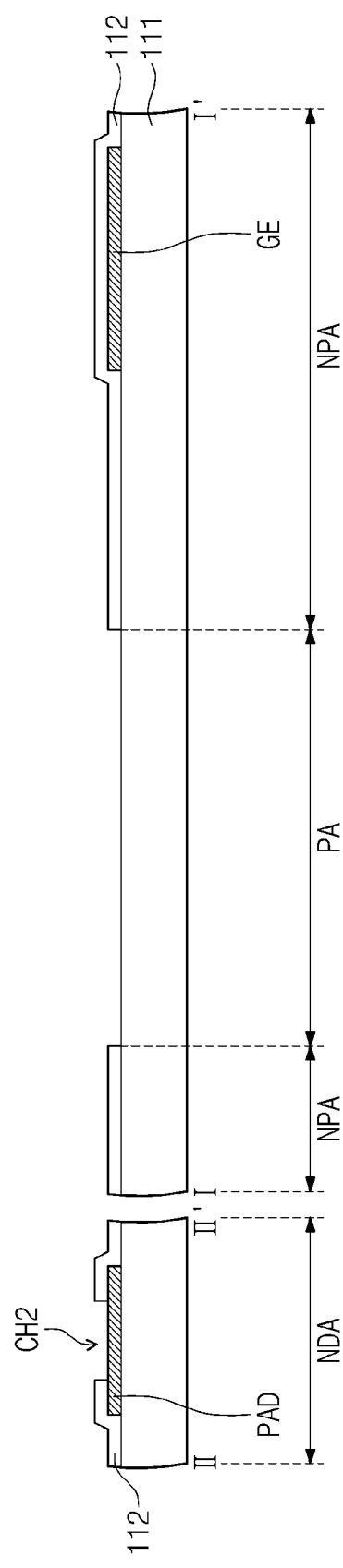

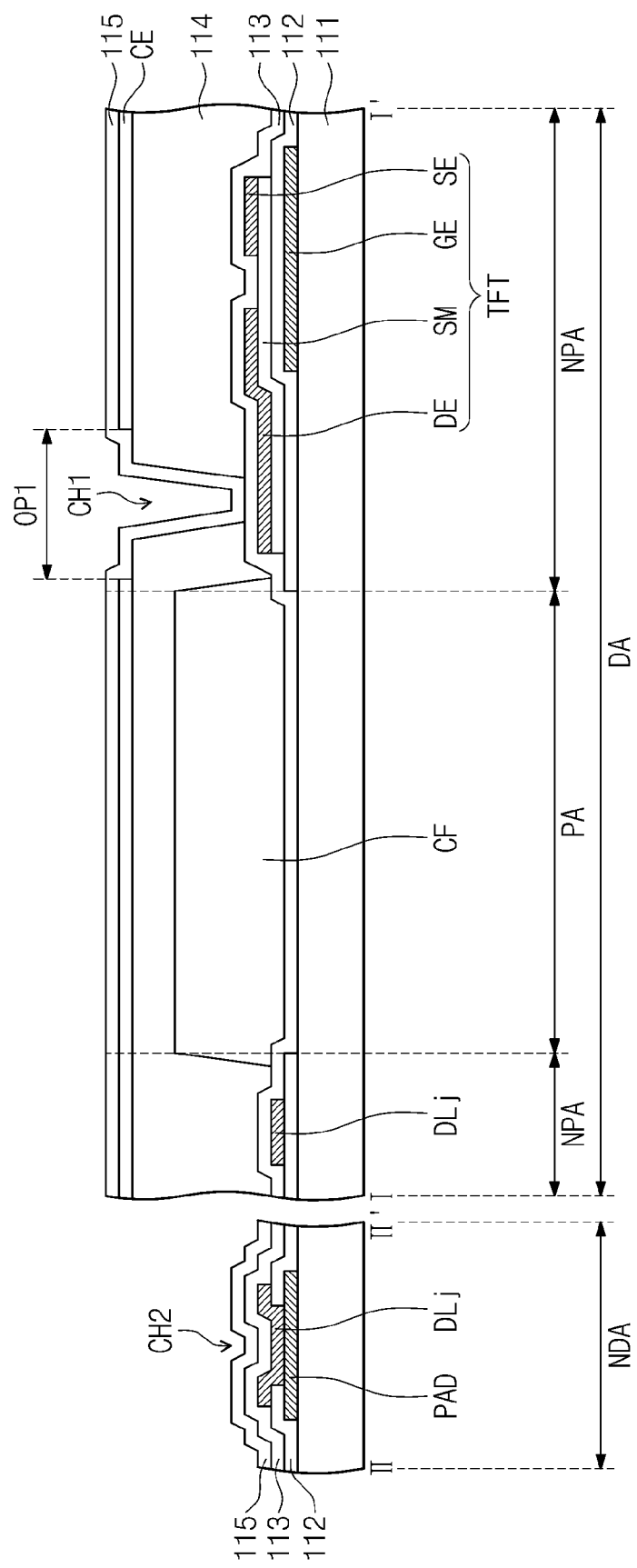

THIN FILM TRANSISTOR SUBSTRATE, DISPLAY APPARATUS HAVING THE SAME, AND MANUFACTURING METHOD THEREOF

This application claims priority to Korean Patent Application No. 10-2013-0134977, filed on Nov. 7, 2013, and all the benefits accruing therefrom under 35 U.S.C. §119, the contents of which are hereby incorporated by reference.

BACKGROUND

1. Field

The invention relates to a thin film transistor substrate, a display apparatus having the thin film transistor substrate, and a method of manufacturing the thin film transistor substrate.

2. Description of the Related Art

In general, a display apparatus includes pixels and an image display layer driven by the pixels. As the image display layer, various image display layers such as a liquid crystal layer, an electrowetting layer, an electrophoretic layer, etc., are used.

Each pixel includes a pixel electrode connected to a thin film transistor and a common electrode to which a common voltage is applied. The thin film transistor is turned on in response to a gate signal. The turned-on thin film transistor receives a data voltage and applies the data voltage to the pixel electrode. The image display layer is driven by an electric field formed by the pixel electrode to which the data voltage is applied and the common electrode to which the common voltage is applied, and displays the image.

The display apparatus, which includes the liquid crystal layer as the image display layer, is classified into an in-plane switching ("IPS") mode, a vertical alignment ("VA") mode, and a plane-to-line switching ("PLS") mode according to the method of driving the liquid crystal layer.

SUMMARY

One or more exemplary embodiment of the invention provides a thin film transistor substrate capable of improving a light transmittance.

One or more exemplary embodiment of the invention provides a display apparatus having the thin film transistor substrate.

One or more exemplary embodiment of the invention provides a method of manufacturing the thin film transistor substrate.

An exemplary embodiment of the invention provides a thin film transistor substrate including a plurality of pixels. Each pixel includes a base substrate including a pixel display area and a pixel non-display area surrounding the pixel display area, a gate electrode on the base substrate in the pixel display area, a first insulating layer which is on the base substrate in the pixel non-display area and covers the gate electrode, a semiconductor layer on the first insulating layer, a predetermined area of which being overlapped with the gate electrode, a source electrode and a drain electrode which are on the semiconductor layer and spaced apart from each other, a second insulating layer which is on the first insulating layer and the base substrate and covers the source electrode and the drain electrode, and a pixel electrode on the second insulating layer in the pixel display area.

The semiconductor layer may include an oxide semiconductor.

The first insulating layer may include a first sub-insulating layer which is on the base substrate in the pixel non-display area and covers the gate electrode, and a second sub-insulating layer on the first sub-insulating layer in the pixel non-display area.

The second insulating layer may include a third sub-insulating layer which is on the second sub-insulating layer and the base substrate and covers the source electrode and the drain electrode, and a fourth sub-insulating layer on the third sub-insulating layer.

The oxide semiconductor may include indium-gallium-zinc oxide, the first and fourth sub-insulating layers may include silicon nitride, and the second and third sub-insulating layers may include silicon oxide.

The thin film transistor substrate may further include a color filter on the second insulating layer in the pixel display area, a third insulating layer on the color filter and the second insulating layer, a common electrode on the third insulating layer, a first opening defined in the common electrode, a fourth insulating layer which is on the third insulating layer and covers the common electrode, a first contact hole which is defined penetrating through the second, third and fourth insulating layers and exposes a predetermined area of the drain electrode, and a black matrix on the fourth insulating layer in the pixel non-display area. The first opening may be overlapped with the first contact hole, the first opening may have a size greater than a size of the first contact hole in a plan view, and the pixel electrode may be on the fourth insulating layer and connected to the drain electrode through the first contact hole.

The thin film transistor substrate may further include a display area in which the plurality of pixels is arranged, and a non-display area adjacent to the display area, a second contact hole defined penetrating through the first insulating layer in the non-display area, a pad electrode on the base substrate in the non-display area, a gate line connected to the gate electrode, a data line connected to the source electrode, and a connection electrode connected to the data line in the non-display area. The first insulating layer may be on the base substrate in the non-display area and cover the pad electrode, and the data line may extend to the non-display area and is connected to the pad electrode through the second contact hole defined penetrating through the first insulating layer.

The thin film transistor substrate may further include a third contact hole defined penetrating through the second and fourth insulating layers and overlapping the second contact hole. The second insulating layer may be on the first insulating layer in the non-display area and cover the data line, the fourth insulating layer may be on the second insulating layer, and the connection electrode may be connected to the data line through the third contact hole defined penetrating through the second and fourth insulating layers.

An exemplary embodiment of the invention provides a display apparatus including a first substrate including a plurality of pixels, a second substrate facing the first substrate, and a liquid crystal layer interposed between the first substrate and the second substrate. Each pixel includes a base substrate including a pixel display area and a pixel non-display area surrounding the pixel display area, a gate electrode on the base substrate in the pixel non-display area, a first insulating layer which is on the base substrate in the pixel non-display area and covers the gate electrode, a semiconductor layer on the first insulating layer, a predetermined area of which being overlapped with the gate electrode, a source electrode and a drain electrode which are on the semiconductor layer and spaced apart from each other, a second insulating layer which is on the first insulating layer and the base substrate and covers the source electrode and the drain electrode, and a pixel electrode on the second insulating layer in the pixel display area.

An exemplary embodiment of the invention provides a manufacturing method of a thin film transistor substrate, which includes a plurality of pixels, including for each pixel, preparing a base substrate including a pixel display area and a pixel non-display area surrounding the pixel display area, forming a gate electrode on the base substrate in the pixel non-display area, forming a first insulating layer on the base substrate to cover the gate electrode and expose the base substrate in the pixel display area, removing the first insulating layer in the pixel non-display area, forming a semiconductor layer on the first insulating layer where a predetermined portion of the semiconductor layer overlaps the gate electrode, forming a source electrode and a drain electrode to be spaced apart from each other on the semiconductor layer, forming a second insulating layer on the base substrate to cover the source and drain electrodes, and forming a pixel electrode on the second insulating layer in the pixel display area.

According to one or more above-described exemplary embodiment, the light transmittance of the thin film transistor substrate may be improved.

BRIEF DESCRIPTION OF THE DRAWINGS

The above and other advantages of the disclosure will become readily apparent by reference to the following detailed description when considered in conjunction with the accompanying drawings in which:

FIGS. 7A to 7I are cross-sectional views showing an exemplary embodiment of a manufacturing method of a thin film transistor substrate according to the invention.

DETAILED DESCRIPTION

Figure 1:
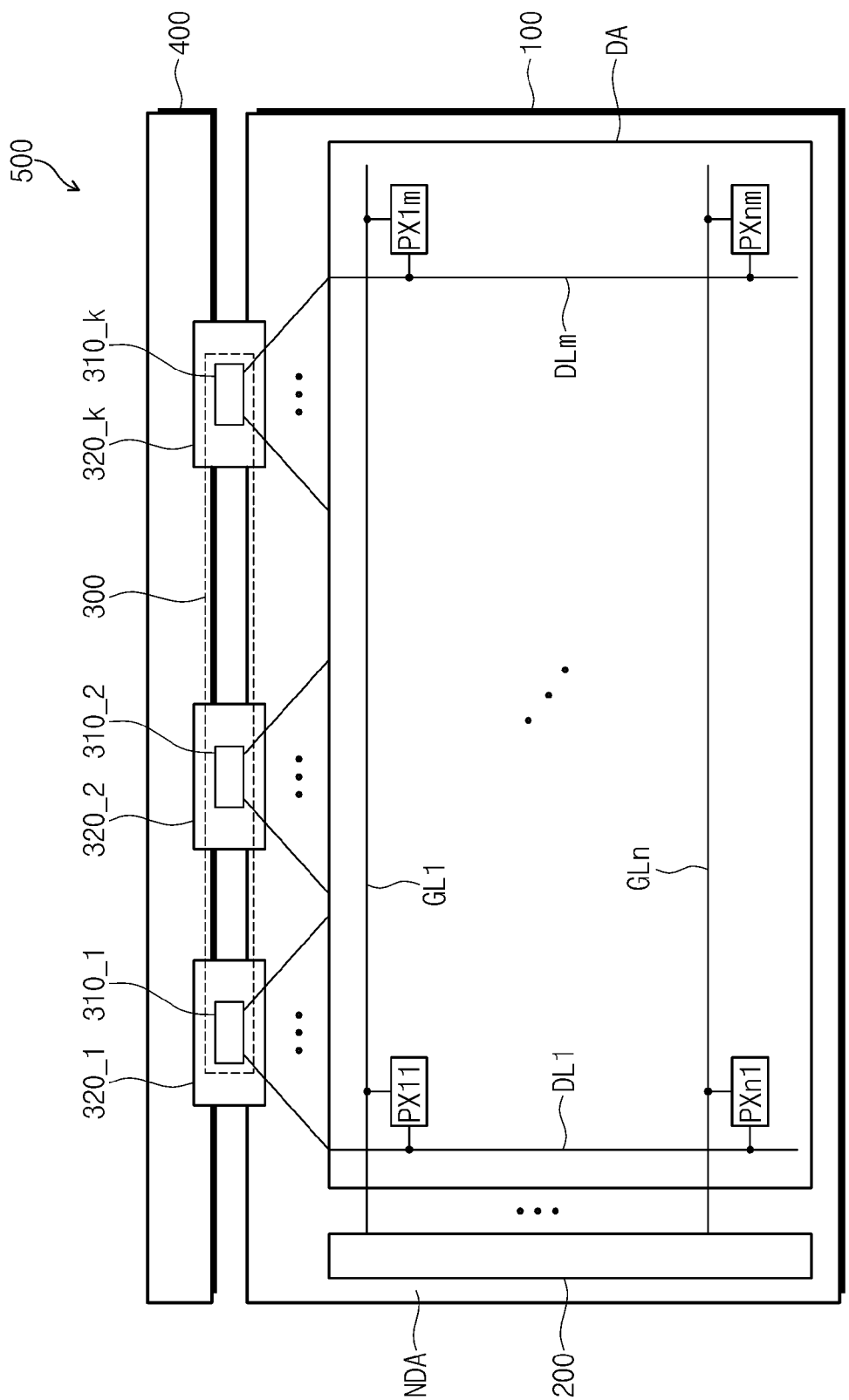
FIG. 1 is a plan view showing an exemplary embodiment of a display apparatus according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

FIG. 1 is a plan view showing an exemplary embodiment of a display apparatus according to the invention.

Referring to FIG. 1, a display apparatus 500 includes a display panel 100, a gate driver 200, a data driver 300 and a driving circuit board 400.

The display panel 100 includes a plurality of pixels PX11 to PXnm, a plurality of gate lines GL1 to GLn, and a plurality of data lines DL1 to DLm. The display panel 100 includes a display area DA, and a non-display area NDA surrounding the display area DA, when viewed in a plan view such as a top plan view.

The pixels PX11 to PXnm are arranged in a matrix form and disposed in the display area DA. In the illustrated exemplary embodiment, for instance, the pixels PX11 to PXnm are arranged in "n" rows by "m" columns crossing each other. In the illustrated exemplary embodiment, each of "m" and "n" is an integer number greater than 0.

The gate lines GL1 to GLn are insulated from the data lines DL1 to DLm while crossing the data lines DL1 to DLm. The gate lines GL1 to GLn are connected to the gate driver 200 to sequentially receive gate signals. The data lines DL1 to DLm are connected to the data driver 300 to receive data voltages such as in analog form.

Each of the pixels PX11 to PXnm is connected to a corresponding gate line of the gate lines GL1 to GLn and a corresponding data line of the data lines DL1 to DLm. The pixels PX11 to PXnm receive the data voltages through the data lines DL1 to DLm in response to the gate signals applied through the gate lines GL1 to GLn. The pixels PX11 to PXnm display gray scales corresponding to the data voltages.

The gate driver 200 generates the gate signals in response to a gate control signal applied from a timing controller (not shown), which may be mounted on the driving circuit board 400. The gate signals are sequentially applied to the pixels PX11 to PXnm through the gate lines GL1 to GLn, such as in a unit of a row among pixel rows. Thus, the pixels PX11 to PXnm are driven in the unit of the row.

The gate driver 200 may be disposed in the non-display area NDA disposed adjacent to a side of the display area DA, such as a left side of the display area DA in FIG. 1. Although not shown in the figures, the gate driver 200 may include a plurality of gate driving chips. The gate driving chips may be mounted on the non-display area NDA disposed adjacent to the left side of the display area DA in a chip on glass ("COG") manner.

However, the invention is not limited thereto or thereby. That is, the gate driving chips may be connected to the non-display area NDA disposed adjacent to the left side of the display area DA in a tape carrier package ("TCP") manner.

The data driver 300 receives image signals and a data control signal from the timing controller. The data driver 300 generates the data voltages in analog form, which correspond to the image signals, in response to the data control signal. The data driver 300 applies the data voltages to the pixels PX11 to PXnm through the data lines DL1 to DLm.

The data driver 300 includes a plurality of source driving chips 310_1 to 310_k. In exemplary embodiments, "k" is an integer number greater than 0 and smaller than "m". Each of the source driving chips 310_1 to 310_k is mounted on a corresponding flexible circuit board among a plurality of flexible circuit boards 320_1 to 320_k, and connected between the driving circuit board 400 and the non-display area NDA of the display panel 100 disposed adjacent to an upper portion of the display area DA. That is, the data driver 300 may be connected to the display panel 100 in the TCP manner.

However, the invention is not limited thereto or thereby. That is, the source driving chips 310_1 to 310_k may be mounted in the non-display area NDA disposed adjacent to the upper portion of the display area DA in the COG manner.

Although not shown in the figures, the data lines DL1 to DLm are connected to the source driving chips 310_1 to 310_k through pad electrodes disposed in the non-display area NDA of the display panel 100 adjacent to the upper portion of the display area DA. In addition, the gate lines GL1 to GLn are connected to the gate driver 200 through pad electrodes disposed in the non-display area NDA of the display panel 100 adjacent to the left side of the display area DA.

Figure 2:
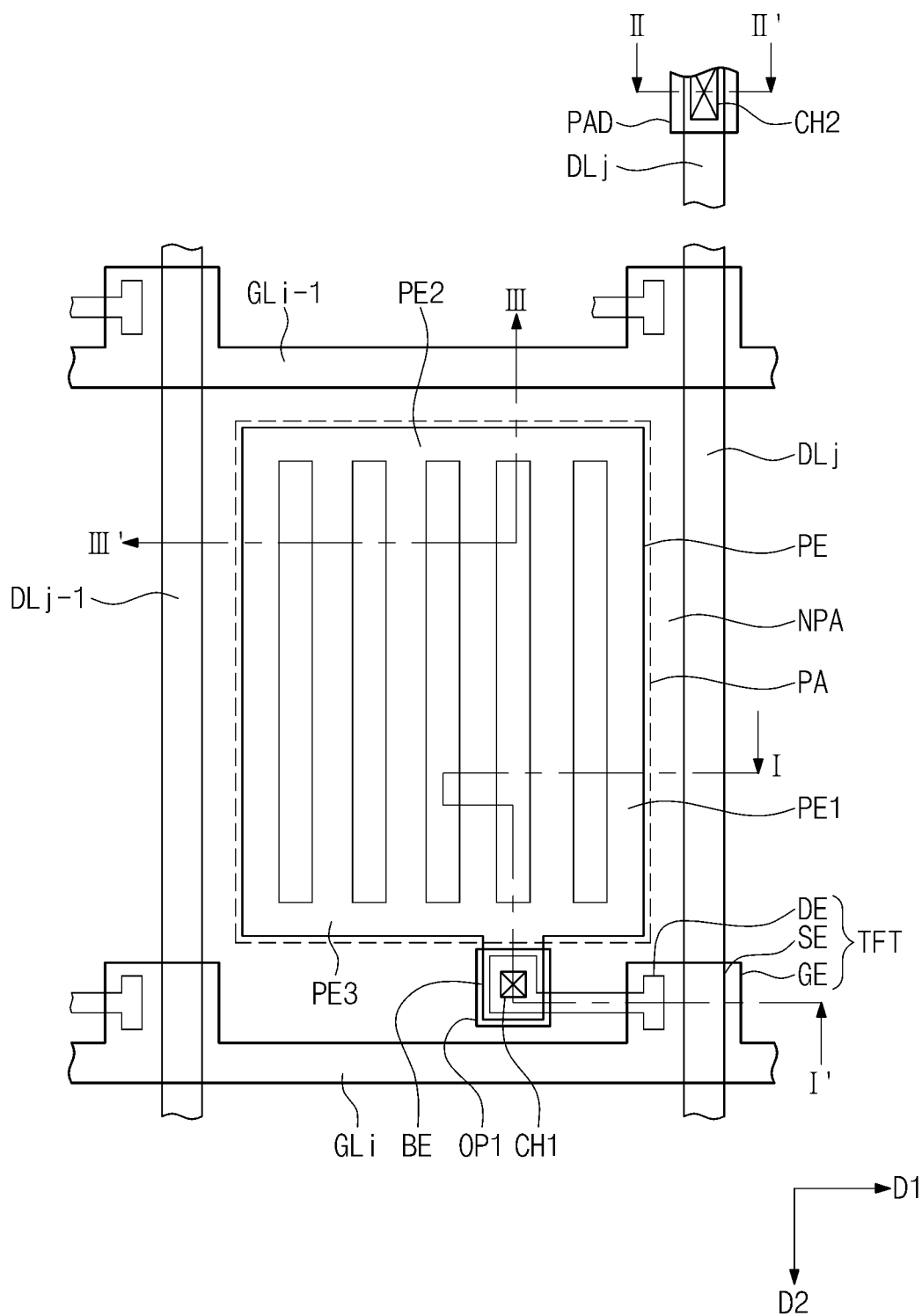
FIG. 2 is a plan view showing an exemplary embodiment of a pixel in FIG. 1.

FIG. 2 is a plan view showing an exemplary embodiment of a pixel in FIG. 1.

In the illustrated exemplary embodiment, the pixels of the display apparatus 500 have the same configuration and function, and thus FIG. 2 shows only one pixel PXij among the pixels PX11 to PXnm. In addition, hereinafter, for the convenience of explanation, the configuration of the one pixel PXij will be described in detail with reference to FIG. 2.

Referring to FIG. 2, the pixel PXij includes a pixel area PA, and a non-pixel area NPA surrounding the pixel area PA, when viewed in a plan view. The pixel area PA of the pixel PXij is an area in which the image is displayed, and the non-pixel area NPA of the pixel PXij is an area in which the image is not displayed.

The non-pixel area NPA is disposed between adjacent pixel areas PA. Thus, since the pixels PX11 to PXnm of the display apparatus 500 include the pixel areas PA corresponding to the pixels PX11 to PXnm, respectively, the non-pixel area NPA is disposed between the adjacent pixel areas PA.

The gate lines GLi_1 and GLi and the data lines DLj-1 and DLj are disposed in the non-pixel area NPA. The gate lines GLi-1 and GLi extend in a first direction D1. The data lines DLj-1 and DLj extend in a second direction D2 substantially perpendicular to the first direction D1 to cross the gate lines GLi-1 and GLi, and the data lines DLj-1 and DLj are insulated from the gate lines GLi-1 and GLi. In the illustrated exemplary embodiment, "i" is an integer number greater than 0 and smaller than "n", and "j" is an integer number greater than 0 and smaller than "m".

The pixel PXij includes a thin film transistor TFT, and a pixel electrode PE connected to the thin film transistor TFT. The thin film transistor TFT is disposed in the non-pixel area NPA. The pixel electrode PE is disposed in the pixel area PA. The thin film transistor TFT of the pixel PXij is connected to a corresponding gate line GLi and a corresponding data line DLj.

The thin film transistor TFT includes a gate electrode GE connected to the gate line GLi, a source electrode SE connected to the data line DLj, and a drain electrode DE connected to the pixel electrode PE.

In detail, the thin film transistor TFT includes the gate electrode GE branched from the gate line GLi, the source electrode SE corresponding to a portion of the data line DLj overlapped with the gate electrode GE, and the drain electrode DE disposed on the gate electrode GE to be spaced apart from the source electrode SE. The drain electrode DE extends in the first direction D1 and is electrically connected to the pixel electrode PE through a first contact hole CH1.

The pixel electrode PE extends from the pixel area PA to the non-pixel area NPA, and is connected to the drain electrode DE of the thin film transistor TFT through the first contact hole CH1 in the non-pixel area NPA. In detail, a branch electrode BE branched from a pixel area portion of the pixel electrode PE is connected to the drain electrode DE of the thin film transistor TFT through the first contact hole CH1. The branch electrode BE is disposed in the non-pixel area NPA.

The pixel electrode PE includes a plurality of branch portions PE1, a first connection portion PE2 and a second connection portion PE3. The branch portions PE1 extend in the second direction D2 and are spaced apart from each other in regular intervals in the first direction D1. The first and second connection portions PE2 and PE3 extend in the first direction D1. The first connection portion PE2 connects first ends of the branch portions PE1 in the second direction D2. The second connection portion PE3 connects second ends opposing the first ends of the branch portions PE1 in the second direction D2.

The data line DLj extends and is connected to a pad electrode PAD through a second contact hole CH2. Although not shown in the figures, the pad electrode PAD is electrically connected to a connection electrode, and the connection electrode is electrically connected to a source driving chip. Thus, the data voltage output from the source driving chip is applied to the data line DLj through the pad electrode PAD. The pad electrode PAD is disposed in and/or on the same layer as the gate electrode GE and the gate line GLi from which the gate electrode GE extends. Details thereof will be described in detail later.

Although not shown in the figures, similar to the data line DLj, the gate line GLi extends and is electrically connected to a pad electrode disposed in and/or on the same layer as the gate electrode GE. The gate signal output from the gate driver 200 is applied to the gate line GLi through the pad electrode connected to the gate line GLi.

Although not shown in FIG. 2, a common electrode (CE in FIG. 3) may be disposed in the pixel PXij. A first opening OP1 may be defined in the common electrode CE. A size of the first opening OP1 is greater than a size of the first contact hole CH1 when viewed in a plan view. Details thereof will be described in detail later.

Figure 3:
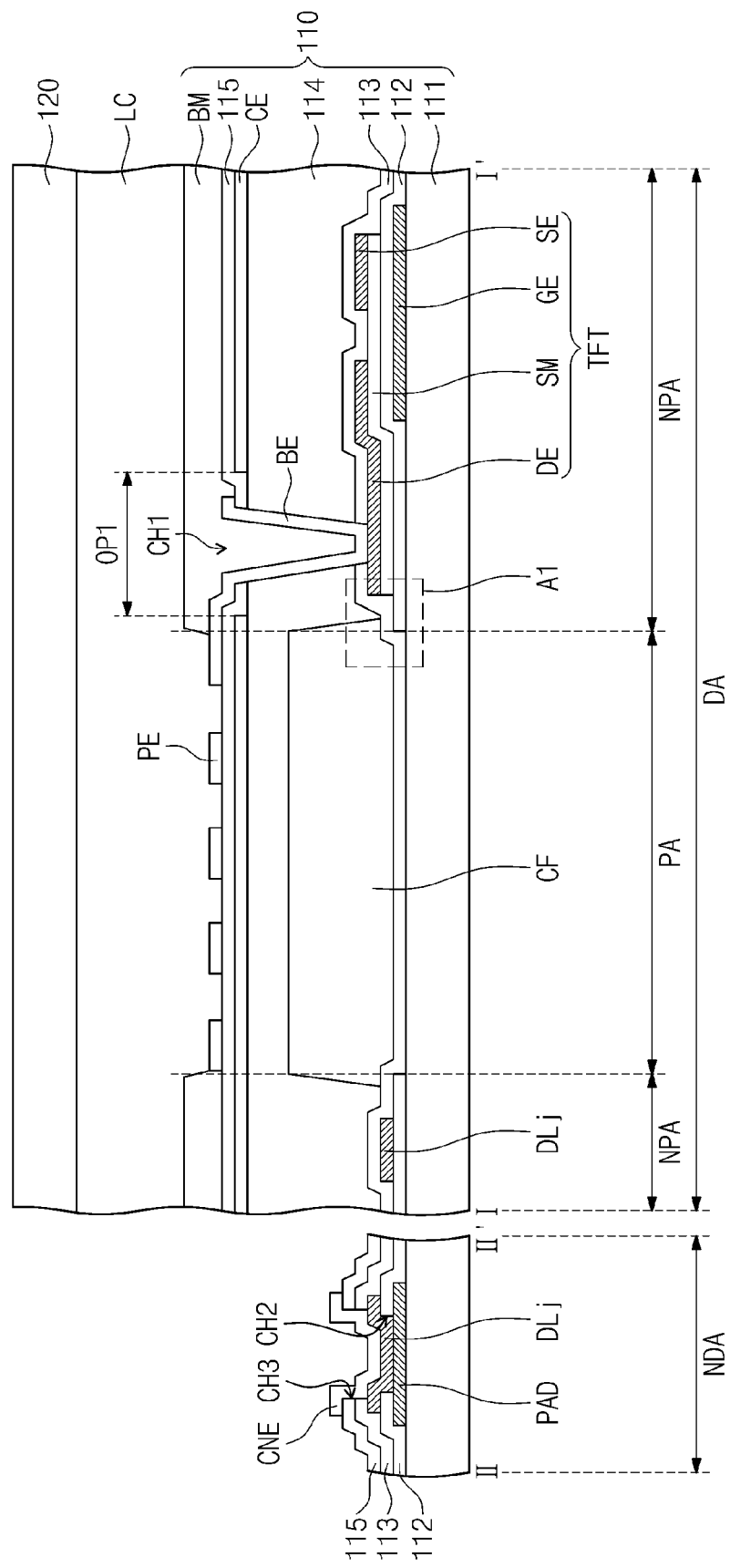
FIG. 3 are cross-sectional views taken along lines I-I' and II-II' of FIG. 2.
Figure 4:
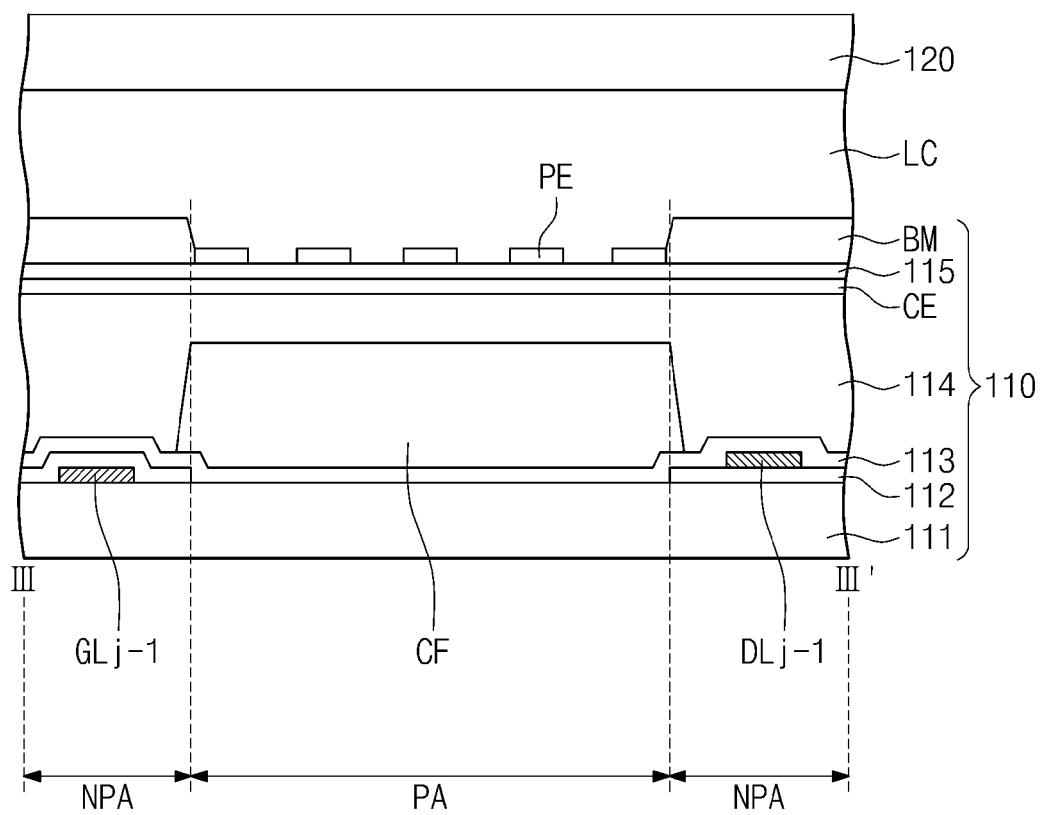
FIG. 4 is a cross-sectional view taken along line III-III' of FIG. 2.

FIG. 3 is cross-sectional view taken along lines I-I' and II-II' of FIG. 2, and FIG. 4 is a cross-sectional view taken along line of FIG. 2.

Referring to FIGS. 3 and 4, the display panel 100 includes a first substrate 110, a second substrate 120 disposed to face the first substrate 110, and a liquid crystal layer LC interposed between the first substrate 110 and the second substrate 120. The first substrate 110 corresponds to a thin film transistor substrate. The pixels PX11 to PXnm are disposed on and defined in the first substrate 110.

The first substrate 110 includes a base substrate 111, the thin film transistor TFT, a color filter CF, first, second, third and fourth insulating layers 112, 113, 114, and 115, the common electrode CE, the pixel electrode PE and a black matrix BM.

With respect to the display panel 100, the base substrate 111 includes the display area DA in which the pixels PX11 to PXnm are disposed, and the non-display area NDA surrounding the display area DA, when viewed in a plan view. In addition, the display area DA of the base substrate 111 includes the pixel areas PA, and the non-pixel area NPA surrounding the pixel areas PA.

The gate electrode GE and the gate line GLi−1 of the thin film transistor TFT are disposed on the base substrate 111 in the non-pixel area NPA. As described earlier, the gate electrode GE is branched from the gate line GLi. The pad electrode PAD is disposed on the base substrate 111 in the non-display area NDA. In an exemplary embodiment of manufacturing the display apparatus 500, the gate electrode GE, the gate lines GLi−1 and GLi, and the pad electrode PAD may be substantially simultaneously formed in the same layer and/or using the same material. The gate electrode GE, the gate lines GLi−1 and GLi, and the pad electrode PAD may be referred to as being in a same single layer of the first substrate 110.

The first insulating layer 112 is disposed on the base substrate 111 in the non-pixel area NPA to cover the gate electrode GE and the gate line GLi−1. The first insulating layer 112 is disposed on the base substrate 111 in the non-display area NDA to cover the pad electrode PAD. The second contact hole CH2 extends to penetrate through the first insulating layer 112 to expose a predetermined area of the pad electrode PAD. The first insulating layer 112 may be an inorganic insulating layer including an inorganic material. In addition, the first insulating layer 112 may serve as a gate insulating layer.

The first insulating layer 112 is not disposed in the pixel area PA. In an exemplary embodiment of manufacturing the display apparatus 500, after a material of the first insulating layer 112 is disposed on the base substrate 111, the material of the first insulating layer 112 disposed in the pixel area PA is removed to omit the first insulating layer 112 from the pixel area PA. A method of removing the first insulating layer 112 in the pixel area PA will be described in detail with reference to FIGS. 7A to 7E.

A semiconductor layer SM of the thin film transistor TFT is disposed on the first insulating layer 112 in the non-pixel area NPA. A predetermined area of the semiconductor layer SM is disposed to overlap with the gate electrode GE. Although not shown in the figures, the semiconductor layer SM includes a multi-layer structure including an active layer and an ohmic contact layer. In addition, the semiconductor layer SM may include an oxide semiconductor. The oxide semiconductor may include indium gallium zinc oxide ("IGZO").

The source electrode SE and the drain electrode DE are disposed to be spaced apart from each other, on the semiconductor layer SM. As described earlier, the source electrode SE corresponds to a linear portion of the data line DLj overlapped with the gate electrode GE.

A portion of the semiconductor layer SM is exposed between the source electrode SE and the drain electrode DE, and forms a conductive channel of the thin film transistor TFT. The data lines DLj−1 and DLj are disposed on the first insulating layer 112 in the non-pixel area NPA. The data line DLj extends and is electrically connected to the pad electrode PAD through the second contact hole CH2. In an exemplary embodiment of manufacturing the display apparatus 500, the data lines DLj−1 and DLj, the source electrode SE, and the drain electrode DE are substantially simultaneously formed in the same layer and/or using the same material. The data lines DLj−1 and DLj, the source electrode SE, and the drain electrode DE may be referred to as being in a same single layer of the first substrate 110.

The second insulating layer 113 is disposed on the base substrate 111 to cover the source electrode SE, the drain electrode DE, and the data lines DLj−1 and DLj. In detail, the second insulating layer 113 is disposed on the first insulating layer 112 in the non-pixel area NPA to cover the source electrode SE, the drain electrode DE, and the data lines DLj−1 and DLj. The second insulating layer 113 is disposed on the base substrate 111 in the pixel area PA.

The second insulating layer 113 may be an inorganic insulating layer including an inorganic material. In addition, the second insulating layer 113 may serve as a passivation layer. The second insulating layer 113 covers the exposed portion of the semiconductor layer SM.

The color filter CF is disposed on the second insulating layer 113 in the pixel area PA. A side surface of the color filter CF is disposed in a predetermined area of the non-pixel area NPA adjacent to the pixel area PA.

The color filter CF provides a color to a light passing through the pixel PXij. The color filter CF may be one or more of a red color filter, a green color filter and a blue color filter, and the color filter CF is disposed to correspond to the pixel area PA.

The third insulating layer 114 is disposed on the second insulating layer 113 in the display area DA to cover the color filter CF. The third insulating layer 114 may be an organic insulating layer including of an organic material. The color filter CF is disposed between the second insulating layer 113 and the third insulating layer 114 in the pixel area PA.

The common electrode CE is disposed on the third insulating layer 114 in the display area DA. The first opening OP1 is defined in the common electrode CE. The first opening OP1 is disposed in the non-pixel area NPA. The first opening OP1 is an area where the common electrode CE is not formed (e.g., omitted).

The first opening OP1 of the common electrode CE is disposed to overlap with the first contact hole CH1. When viewed in a plan view, the size of the first opening OP1 is greater than that of the first contact hole CH1.

The common electrode CE may include a transparent conductive material. In exemplary embodiments, for instance, the common electrode CE may include a transparent conductive metal oxide, such as indium tin oxide ("ITO"), indium zinc oxide ("IZO"), indium tin zinc oxide ("ITZO"), etc.

The fourth insulating layer 115 is disposed on the third insulating layer 114 to cover the common electrode CE. That is, the common electrode CE is disposed between the third insulating layer 114 and the fourth insulating layer 115. The fourth insulating layer 115 may be an inorganic insulating layer including an inorganic material.

The first contact hole CH1 penetrates through the second insulating layer 113, the third insulating layer 114 and the fourth insulating layer 115 to expose the predetermined area of the drain electrode DE of the thin film transistor TFT. The first contact hole CH1 is disposed to overlap with the first opening OP1 of the common electrode CE. In addition, when viewed in a plan view, the size of the first contact hole CH1 is smaller than that of the first opening OP1.

The pixel electrode PE is disposed on the fourth insulating layer 115 in the pixel area PA. The fourth insulating layer 115 electrically insulates the pixel electrode PE from the common electrode CE. The pixel electrode PE forms an electric field in cooperation with the common electrode CE. The pixel electrode PE is electrically connected to the drain electrode DE of the thin film transistor TFT through the first contact hole CH1.

In detail, the branch electrode BE branched from the pixel area portion of the pixel electrode PE is electrically connected to the drain electrode DE of the thin film transistor TFT through the first contact hole CH1 in the non-pixel area NPA. Thus, the thin film transistor TFT is electrically connected to the pixel electrode PE.

The first opening OP1 of the common electrode CE is overlapped with the first contact hole CH1, and the size of the first opening OP1 is greater than that of the first contact hole CH1 when viewed in a plan view. Thus, even though the branch electrode BE branched from the pixel electrode PE is connected to the drain electrode DE through the first contact hole CH1, electrical shorting of the branch electrode BE with respect to the common electrode CE may be reduced or effectively prevented.

The pixel electrode PE and the branch electrode BE may include a transparent conductive material. In exemplary embodiments, for instance, the pixel electrode PE and the branch electrode BE may include a transparent conductive metal oxide, such as ITO, IZO, ITZO, etc.

The second insulating layer 113 is disposed on the first insulating layer 112 in the non-display area NDA to cover the data line DLj. In addition, the fourth insulating layer 115 is disposed on the second insulating layer 113 in the non-display area NDA. A third contact hole CH3 is defined penetrating through the second insulating layer 113 and the fourth insulating layer 115 to expose a predetermined area of the data line DLj in the non-display area NDA.

The third contact hole CH3 is disposed to overlap with the second contact hole CH2. The third contact hole CH3 has a size greater than that of the second contact hole CH2. In detail, when viewed in a plan view, the size of the third contact hole CH3 is greater than the size of the second contact hole CH2, but the invention is not limited thereto or thereby. That is, the third contact hole CH3 may have the same size as that of the second contact hole CH2 when viewed in a plan view.

A connection electrode CNE is disposed on the data line DLj exposed through the third contact hole CH3 and on the fourth insulating layer 115 disposed adjacent to the third contact hole CH3. The connection electrode CNE is electrically connected to the data line DLj.

Although not shown in the figures, the source driving chip may be electrically connected to the connection electrode CNE. Therefore, the data line DLj may be electrically connected to the source driving chip through the pad electrode PAD and the connection electrode CNE. In an exemplary embodiment of manufacturing the display apparatus 500, the branch electrode BE, the connection electrode CNE and the pixel electrode PE may be substantially simultaneously formed in a same layer and/or using the same material. The branch electrode BE, the connection electrode CNE and the pixel electrode PE may be referred to as being in a same single layer of the first substrate 110.

The black matrix BM is disposed on the fourth insulating layer 115 in the non-pixel area NPA. Thus, the black matrix BM may be disposed on the branch electrode BE disposed in the non-pixel area NPA. A boundary edger or surface of the black matrix BM may be disposed in a boundary area between the pixel area PA and the non-pixel area NPA.

The black matrix BM blocks a light that may be unnecessary to display the image. The black matrix BM may reduce or effectively prevent light leakage caused by malfunction of liquid crystal molecules of the liquid crystal layer LC at edges of the pixel area PA or color mixture occurring at edges of the color filter CF.

The display apparatus including the pixel electrode PE and the common electrode CE, which are arranged in the manner as shown in FIGS. 2 and 3, may serve as a plane to line switching ("PLS") mode liquid crystal display. In the PLS mode liquid crystal display, a fringe field is formed by the pixel electrode PE applied with the data voltage and the common electrode CE applied with the common voltage.

The liquid crystal molecules of the liquid crystal layer LC are driven by the fringe field in the PLS mode liquid crystal display. A light transmittance of the liquid crystal layer LC is controlled by the liquid crystal molecules driven by the fringe electric field, and thus desired images are displayed.

In a conventional display apparatus where the first insulating layer 112 is disposed in the pixel area PA, both the first and second insulating layers 112 and 113 are disposed in the pixel area PA. In the conventional display apparatus, a backlight unit may be disposed under the display panel 100 to supply the light to the display panel 100. Since both the first and second insulating layers 112 and 113 are disposed in the pixel area PA, the light transmittance in the pixel area PA of the display panel 100 may be reduced by the first and second insulating layers 112 and 113.

In one or more exemplary embodiment according to the invention, however, the first insulating layer 112 is not disposed and omitted in the pixel area PA. Since only the first insulating layer 112 among the first and second insulating layers 112 and 113 is disposed in the pixel area PA, the light transmittance in the pixel area PA may be improved compared to the conventional display apparatus where the first insulating layer 112 remains in the pixel area PA.

In addition, the PLS mode liquid crystal display apparatus has been described as a representative example. However, the invention is not limited to the PLS mode liquid crystal display apparatus. That is, one or more exemplary embodiment of the display apparatus according to the invention may be applied to an in-plane switching ("IPS") mode display apparatus and a vertical alignment ("VA") mode display apparatus. In an exemplary embodiment of manufacturing a display apparatus, for instance, in the IPS mode display apparatus and the VA mode display apparatus, a material of the first insulating layer 112 is disposed on the base substrate 111 to cover the gate electrode GE of the thin film transistor TFT, and then, the material of the first insulating layer 112 is removed in the pixel area PA. Since the material of the first insulating layer 112 is removed in the pixel area PA, the light transmittance of the display apparatus becomes higher since the first insulating layer 112 is not disposed in (e.g., excluded from) the pixel area PA.

Consequently, one or more exemplary embodiment of the first substrate 110 as a thin film transistor substrate, and the display apparatus 500 having the thin film transistor substrate 110 according to the invention may have improved light transmittance.

Figure 5:
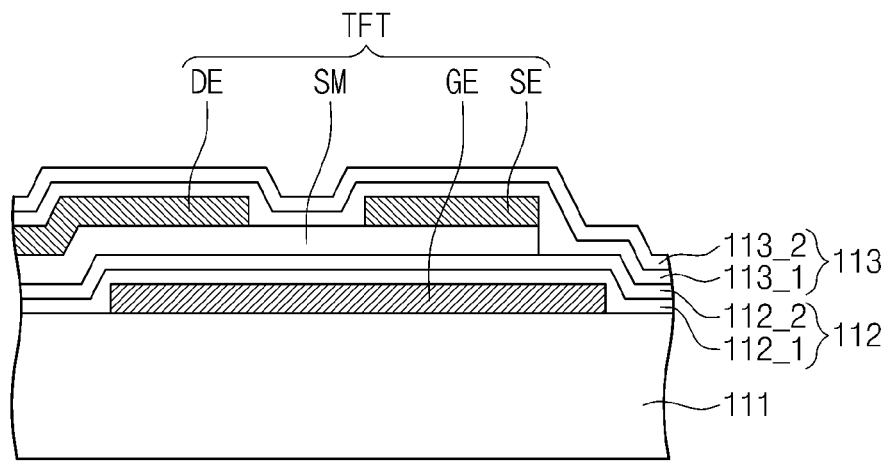
FIG. 5 is an enlarged cross-sectional view showing an exemplary embodiment of a thin film transistor in FIG. 3.
Figure 6:
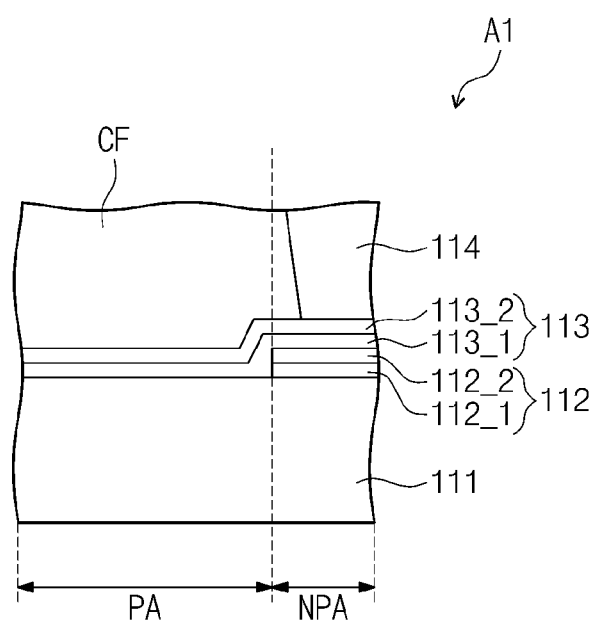
FIG. 6 is an enlarged cross-sectional view showing an exemplary embodiment of a first area A1 in FIG. 3.

FIG. 5 is an enlarged cross-sectional view showing an exemplary embodiment of a thin film transistor in FIG. 3, and FIG. 6 is an enlarged cross-sectional view showing first area A1 in FIG. 3.

Referring to FIGS. 5 and 6, the first insulating layer 112 includes a first sub-insulating layer 112_1 and a second sub-insulating layer 112_2. The first sub-insulating layer 112_1 is disposed on the base substrate 111 in the non-pixel area NPA to cover the gate electrode GE. The second sub-insulating layer 112_2 is disposed on the first sub-insulating layer 112_1 in the non-pixel area NPA.

The first sub-insulating layer 112_1 includes silicon nitride (SiNx). The second sub-insulating layer 112_2 includes silicon oxide (SiOx).

The second insulating layer 113 includes a third sub-insulating layer 113_1 and a fourth sub-insulating layer 113_2. The third sub-insulating layer 113_1 is disposed on the second sub-insulating layer 112_2 and the base substrate 111 to cover the source electrode SE and the drain electrode DE. The fourth sub-insulating layer 113_2 is disposed on the third sub-insulating layer 113_1.

The third sub-insulating layer 113_1 includes silicon oxide (SiOx). The fourth sub-insulating layer 113_2 includes silicon nitride (SiNx).

The third sub-insulating layer 113_1 covers the exposed upper portion of the semiconductor layer SM. The semiconductor layer SM including oxide semiconductor such as including IGZO is disposed between the second sub-insulating layer 112_2 and the third sub-insulating layer 113_1.

Silicon nitride (SiNx) may include an impurity, e.g., hydrogen. When hydrogen is applied to the oxide semiconductor including IGZO, semiconductor characteristics of the oxide semiconductor including the IGZO may be deteriorated. Silicon oxide (SiOx) may reduce or effectively prevent hydrogen from being applied to the oxide semiconductor including IGZO.

That is, the second sub-insulating layer 112_2 and the third sub-insulating layer 113_1, which each include silicon oxide (SiOx), may reduce or effectively prevent hydrogen, which is in the first sub-insulating layer 112_1 and the fourth sub-insulating layer 113_2 each including silicon nitride, (SiNx), from being applied to the semiconductor layer SM.

In a conventional display apparatus where the first and second sub-insulating layers 112_1 and 112_2 are disposed in the pixel area PA, all of the first to fourth sub-insulating layers 112_1, 112_2, 113_1 and 113_2 are disposed in the pixel area PA. In the conventional display apparatus, a backlight unit may be disposed under the display panel 100 to supply the light to the display panel 100. Since all of the first to fourth sub-insulating layers 112_1, 112_2, 113_1, and 113_2 are disposed in the pixel area PA, the light transmittance of the display apparatus is deteriorated.

In one or more exemplary embodiment according to the invention, however, the first and second sub-insulating layers 112_1 and 112_2 are not disposed in and omitted from the pixel area PA. Since only the third and fourth sub-insulating layers 113_1 and among the first to fourth sub-insulating layers 112_1, 112_2, 113_1, and 113_2 are disposed in the pixel area PA, the light transmittance may be improved compared to the conventional display apparatus where the first and second sub-insulating layers 112_1 and 112_2 are disposed in the pixel area PA.

Consequently, one or more exemplary embodiment of the first substrate 110 as a thin film transistor substrate and the display apparatus 500 including the thin film transistor substrate 110 according to the invention may improve the light transmittance.

FIGS. 7A to 7I are cross-sectional views showing an exemplary embodiment of a manufacturing method of a thin film transistor substrate according to the invention.

For the convenience of explanation, FIGS. 7A to 7I show the exemplary embodiment of the manufacturing method of the thin film transistor substrate with reference to the cross-sectional views shown in FIGS. 3 and 4.

Since the configuration of the pixel shown in FIG. 5 results from the configuration of the pixel shown in FIGS. 3 and 4, FIG. 5 will not be explicitly used to describe the manufacturing method of the thin film transistor in FIGS. 7A to 7I.

Figure 7A:
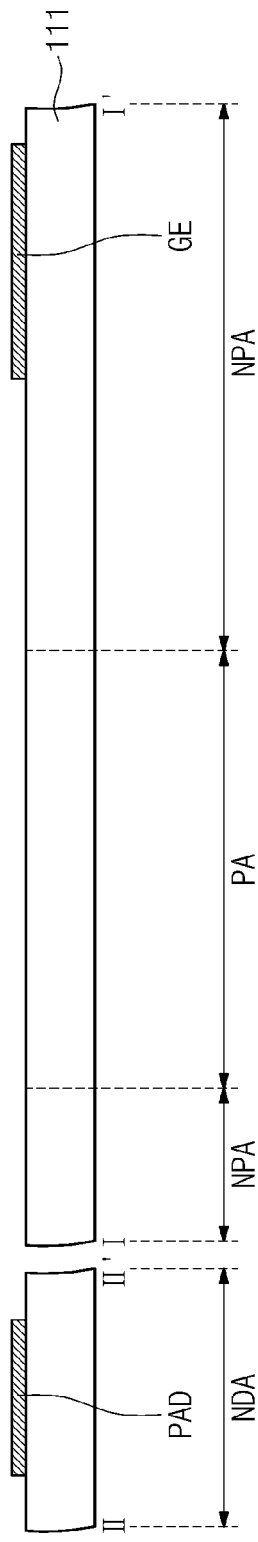

Referring to FIG. 7A, the base substrate 111 is prepared, and the gate electrode GE is formed on the base substrate 111 in the non-pixel area NPA. In addition, the pad electrode PAD is formed on the base substrate 111 in the non-display area NDA. Although not shown in the figures, the gate lines GLi–1 and GLi extend in the first direction D1 on the base substrate 111.

The gate electrode GE, the gate lines GLi–1 and GLi, and the pad electrode PAD may be substantially simultaneously patterned and formed in and/or on a same layer, using the same material.

Figure 7B:
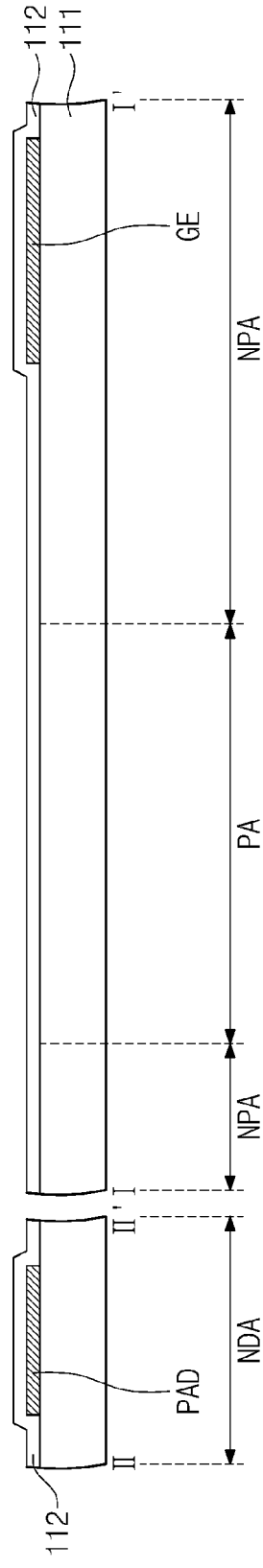

Referring to FIG. 7B, a material layer of the first insulating layer (labeled 112 for convenience of illustration) is formed on the base substrate 111 to cover the gate electrode GE and the pad electrode PAD. Although not shown in the figures, the material layer of the first insulating layer 112 is formed on the base substrate 111 to cover the gate lines GLi-1 and GLi.

Figure 7C:
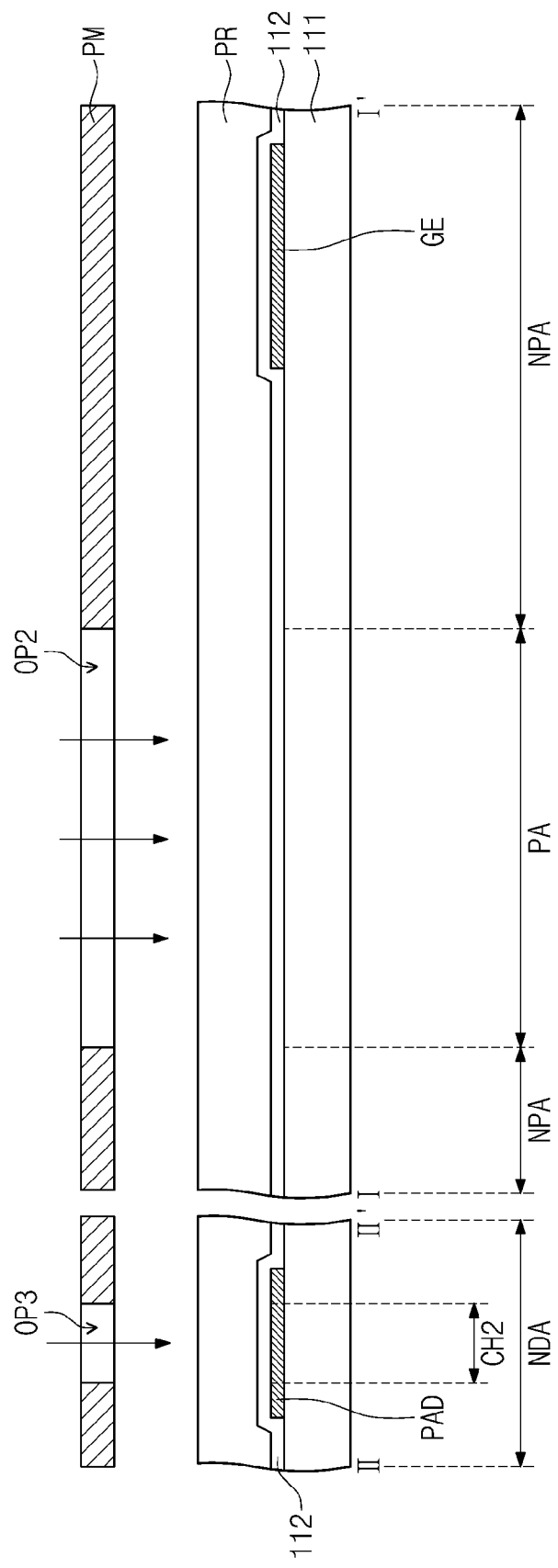

Referring to FIG. 7C, a photosensitive resin PR (or, a photoresist) is formed on the material layer of the first insulating layer 112. A photo mask PM is disposed above the photosensitive resin PR. A second opening OP2 and a third opening OP3 are defined in the photo mask PM. The second opening OP2 overlaps the pixel area PA and the third opening OP3 overlaps an area where the second contact hole CH2 is formed.

After the photo mask PM is disposed above the photoresist resin PR, the photosensitive resin PR is exposed to a light (indicated by the downward arrows) through the second opening OP2 and the third opening OP3.

Referring to FIG. 7D, the photosensitive resin PR is developed to remove the photosensitive resin PR from the area where the second contact hole CH2 is formed and from the pixel area PA. Thus, material layer of the first insulating layer 112 is exposed through the area where the second contact hole CH2 is formed and through the pixel area PA.

Referring to FIG. 7E, the material layer of the first insulating layer 112 is etched and removed using a remaining photosensitive resin PR as a mask. Then, the photosensitive resin PR is removed. Thus, the material layer of the first insulating layer 112 is removed in the pixel area PA as shown in FIG. 7E.

In addition, the material layer of the first insulating layer 112 is removed in the area where the second contact hole CH2 is formed. Therefore, the second contact hole CH2, through which a predetermined area of the pad electrode PAD is exposed, is formed by removing a predetermined area of the material layer of the first insulating layer 112 in the non-display area NDA.

The manufacturing processes described with reference to FIGS. 7C to 7E may be collectively defined as a photoresist process.

The process of removing the material layer of the first insulating layer 112 in the pixel area PA is substantially simultaneously performed with the process of forming the second contact hole CH2. Thus, an additional process to remove the material layer of the first insulating layer 112 in the pixel area PA to form the first insulating layer 112 is not required.

Figure 7F:
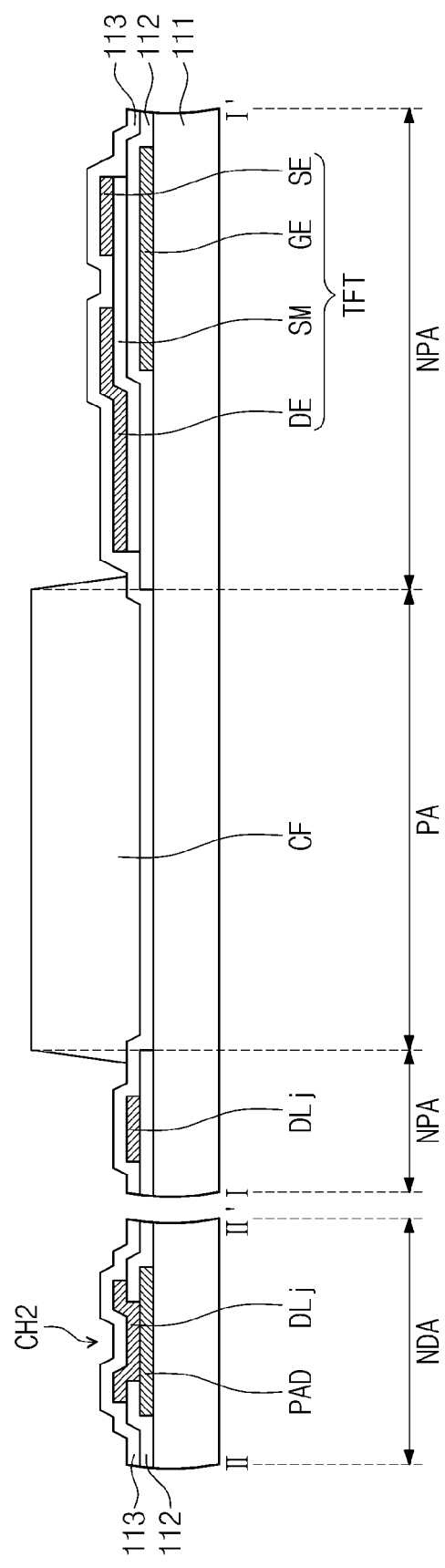

Referring to FIG. 7F, the semiconductor layer SM is formed on the first insulating layer 112 in the non-pixel area NPA. The predetermined area of the semiconductor layer SM is formed to overlap with the gate electrode GE.

The source electrode SE and the drain electrode DE are formed to be spaced apart from each other, on the semiconductor layer SM. Also, the data line DLj is formed on the first insulating layer 112 in the non-pixel area NPA. The data line DLj extends and is electrically connected to the pad electrode PAD through the second contact hole CH2. Although not shown in the figures, the data line DLj-1 is formed on the first insulating layer 112 in the non-pixel area NPA.

The data lines DLj-1 and DLj, the source electrode SE, and the drain electrode DE are substantially simultaneously patterned and formed in and/or on the same layer, using the same material.

A material layer of the second insulating layer 113 (labeled 113 for convenience of illustration) is formed on the base substrate 111 to cover the data line DLj, the source electrode SE and the drain electrode DE. Although not shown in the figures, the material layer of the second insulating layer 113 is formed on the base substrate 111 to cover the data line DLj-1.

The color filter CF is formed on the material layer of the second insulating layer 113 in the pixel area PA.

Referring to FIG. 7G, a material layer of the third insulating layer 114 (labeled 114 for convenience of illustration) is formed on the material layer of the second insulating layer 113 in the display area DA to cover the color filter CF. The material layer of the third insulating layer 114 disposed in an area corresponding to the first contact hole CH1 is removed to form the third insulating layer 114. Thus, the third insulating layer 114 is formed to expose a predetermined area of the material layer of the second insulating layer 113 corresponding to the first contact hole CH1.

The common electrode CE is formed on the third insulating layer 114 in the display area DA. The first opening OP1 is defined in the common electrode CE. When viewed in a plan view, the size of the first opening OP1 in the common electrode CE is greater than that of the first contact hole CH1 in the third insulating layer 114.

A material layer of the fourth insulating layer 115 (labeled 115 for convenience of illustration) is formed on the third insulating layer 114 to cover the common electrode CE. In addition, the material layer of the fourth insulating layer 115 is formed on the material layer of the second insulating layer 113 and on a side surface of the third insulating layer 114 in the area corresponding to the first contact hole CH1. The material layer of the fourth insulating layer 115 is formed on the material layer of the second insulating layer 113 in the non-display area NDA.

Figure 7H:
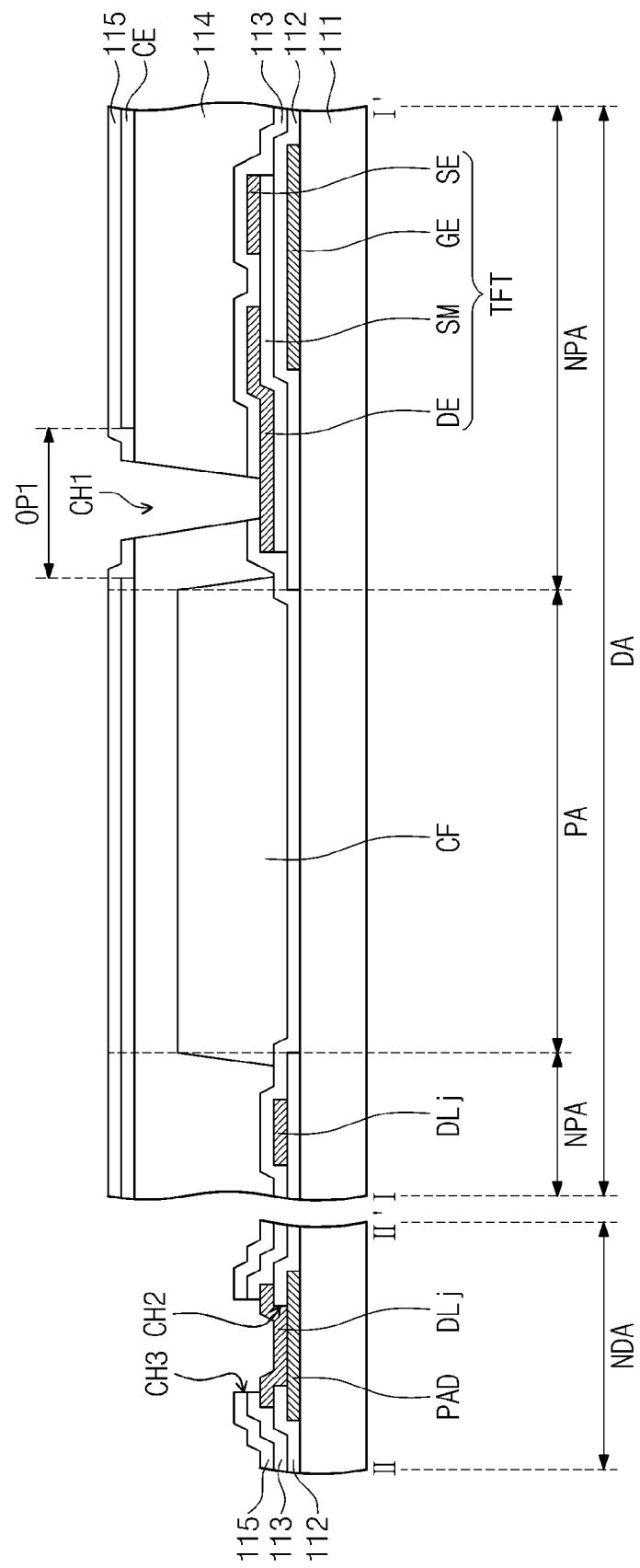

Referring to FIG. 7H, the first contact hole CH1 is formed penetrating through the material layers of the second insulating layer 113 and the fourth insulating layer 115, to expose the predetermined area of the drain electrode DE of the thin film transistor TFT.

The third contact hole CH3 is formed by removing predetermined areas of the material layers of the second and fourth insulating layers 113 and 115 in the non-display area NDA to expose the predetermined area of the data line DLj. As described above, the third contact hole CH3 is formed to overlap with the second contact hole CH2. The forming the first through third contact holes CH1 through CH3 may form the second and fourth insulating layers 113 and 115.

Although not shown in the figures, the process of forming the first contact hole CH1 and the third contact hole CH3 are performed by a photoresist process. To this end, a photosensitive resin is formed on the material layer of the fourth insulating layer 115, and then the photosensitive resin is removed in the areas where the first and third contact holes CH1 and CH3 are formed using a photo mask.

Then, the material layers of the second insulating layer 113 and the fourth insulating layer 115 are etched and removed using a remaining photosensitive resin as a mask, and the remaining photosensitive resin is removed.

Figure 7I:
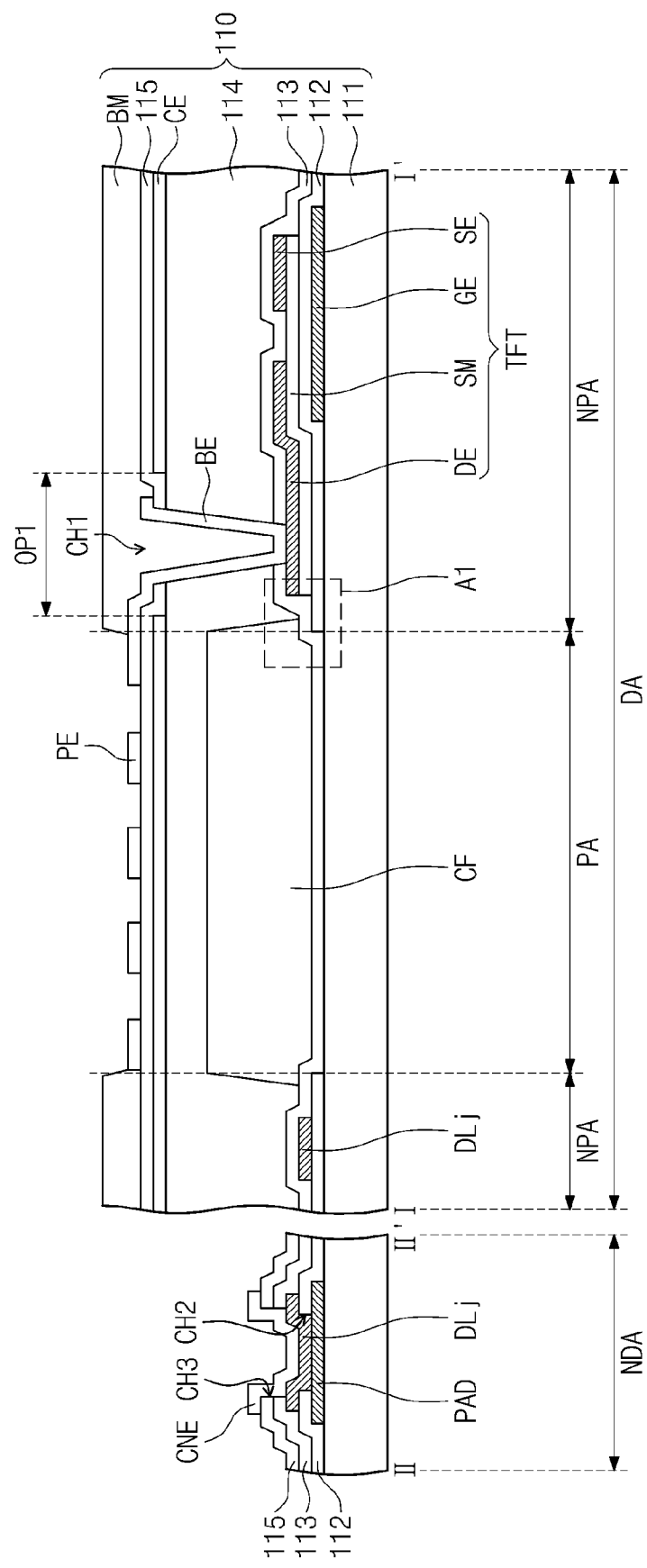

Referring to FIG. 7I, the pixel electrode PE is formed on the fourth insulating layer 115 in the pixel area PA. The fourth insulating layer 115 electrically insulates the pixel electrode PE from the common electrode CE. The branch electrode BE branched from the pixel electrode PE is electrically connected to the drain electrode DE of the thin film transistor TFT through the first contact hole CH1 in the non-pixel area NPA.

When viewed in a plan view, the size of the first opening OP1 of the common electrode CE is greater than that of the first contact hole CH1. Thus, even though the branch electrode BE branched from the pixel electrode PE is connected to the drain electrode DE through the first contact hole CH1. electrical shorting of the branch electrode BE with respect to the common electrode CE may be reduced or effectively prevented.

The connection electrode CNE is formed on the data line DLj exposed through the third contact hole CH3 and on the fourth insulating layer 115 disposed adjacent to the third contact hole CH3. The connection electrode CNE is electrically connected to the data line DLj.

The branch electrode BE, the connection electrode CNE, and the pixel electrode PE may be substantially simultaneously patterned and formed in and/or on the same layer, using the same material.

The black matrix BM is formed on the fourth insulating layer 115 in the non-pixel area NPA, to form the first substrate 110.

Referring again to FIG. 3, the second substrate 120 is disposed to face the first substrate 110, and liquid crystals are injected between the first and second substrates 110 and 120 to form the liquid crystal layer LC, to thereby complete the display apparatus 500.

According to one or more exemplary embodiment described above, material for forming the first insulating layer 112 disposed in the pixel area PA is removed during the manufacturing process of the thin film transistor substrate 110. Thus, the light transmittance becomes higher compared to that when the first insulating layer 112 remains in the pixel area PA.

Consequently, one or more exemplary embodiment of the thin film transistor substrate 110 according to the invention may have improved light transmittance.

Although exemplary embodiments of the invention have been described, it is understood that the invention is not be limited to these exemplary embodiments but various changes and modifications can be made by one ordinary skilled in the art within the spirit and scope of the invention as hereinafter claimed.

What is claimed is:

1. A thin film transistor substrate comprising:
a plurality of pixels, each pixel comprising:
a base substrate comprising a pixel display area, and a pixel non-display area surrounding the pixel display area;
a gate electrode on the base substrate in the pixel non-display area;
a first insulating layer which is on the base substrate in the pixel non-display area and covers the gate electrode, the first insulating layer terminating at an edge thereof to expose a portion of the base substrate in the pixel display area;
a semiconductor layer on the first insulating layer, wherein a predetermined area of the semiconductor layer is overlapped with the gate electrode;
a source electrode and a drain electrode which are on the semiconductor layer and spaced apart from each other;
a second insulating layer which is on the first insulating layer and the base substrate, and covers the source electrode and the drain electrode, the second insulating layer covering the source and drain electrodes extending to contact the edge of the first insulating layer which exposes the portion of the base substrate in the pixel area; and
a pixel electrode on the second insulating layer, in the pixel display area, the pixel electrode in the pixel display area overlapping the exposed portion of the base substrate in the pixel display area.

2. The thin film transistor substrate of claim 1, wherein the semiconductor layer comprises an oxide semiconductor.

3. The thin film transistor substrate of claim 2, wherein the first insulating layer comprises:
a first sub-insulating layer which is on the base substrate in the pixel non-display area and covers the gate electrode; and
a second sub-insulating layer on the first sub-insulating layer in the pixel non-display area.

4. The thin film transistor substrate of claim 3, wherein the second insulating layer comprises:
a third sub-insulating layer which is on the second sub-insulating layer and the base substrate, and covers the source electrode and the drain electrode; and
a fourth sub-insulating layer on the third sub-insulating layer.

5. The thin film transistor substrate of claim 4, wherein the oxide semiconductor comprises indium-gallium-zinc oxide,
the first and fourth sub-insulating layers comprise silicon nitride, and
the second and third sub-insulating layers comprise silicon oxide.

6. The thin film transistor substrate of claim 1, further comprising:
a color filter on the second insulating layer in the pixel display area;
a third insulating layer on the color filter and the second insulating layer;
a common electrode on the third insulating layer, and a first opening defined in the common electrode;
a fourth insulating layer which is on the third insulating layer and covers the common electrode;
a first contact hole which is defined penetrating through the second, third and fourth insulating layers and exposes a predetermined area of the drain electrode; and
a black matrix on the fourth insulating layer in the pixel non-display area,
wherein
the first opening is overlapped with the first contact hole, and the first opening has a size greater than a size of the first contact hole in a plan view, and
the pixel electrode is on the fourth insulating layer and connected to the drain electrode through the first contact hole.

7. The thin film transistor substrate of claim 6, further comprising:
a display area in which the plurality of pixels is arranged, and a non-display area adjacent to the display area;
a second contact hole defined penetrating through the first insulating layer in the non-display area;
a pad electrode on the base substrate in the non-display area;
a gate line connected to the gate electrode;
a data line connected to the source electrode; and
a connection electrode connected to the data line in the non-display area,
wherein
the first insulating layer is on the base substrate in the non-display area and covers the pad electrode, and
the data line extends to the non-display area and is connected to the pad electrode through the second contact hole defined penetrating through the first insulating layer.

8. The thin film transistor substrate of claim 7, further comprising:

a third contact hole defined penetrating through the second and fourth insulating layers and overlapping the second contact hole,
wherein
the second insulating layer is on the first insulating layer in the non-display area and covers the data line,
the fourth insulating layer is on the second insulating layer,
the connection electrode is connected to the data line through the third contact hole defined penetrating through the second and fourth insulating layers.

9. The thin film transistor substrate of claim 1, wherein the second insulating layer contacting the edge of the first insulating layer which exposes the portion of the base substrate in the pixel area extends to be disposed on the base substrate in the pixel display area, and the second insulating layer extended to be disposed on the base substrate in the pixel display area is overlapped with the exposed portion of the base substrate in the pixel display area.

10. A display apparatus comprising:
a first substrate comprising a plurality of pixels;
a second substrate facing the first substrate; and
a liquid crystal layer between the first substrate and the second substrate, each pixel comprising:
a base substrate comprising a pixel display area, and a pixel non-display area surrounding the pixel display area;
a gate electrode on the base substrate in the pixel non-display area;
a first insulating layer which is on the base substrate in the pixel non-display area and covers the gate electrode, the first insulating layer terminating at an edge thereof to expose a portion of the base substrate in the pixel display area;
a semiconductor layer on the first insulating layer, wherein a predetermined area of the semiconductor layer is overlapped with the gate electrode;
a source electrode and a drain electrode which are on the semiconductor layer and spaced apart from each other;
a second insulating layer which is on the first insulating layer and the base substrate, and covers the source electrode and the drain electrode, the second insulating layer covering the source and drain electrodes extending to contact the edge of the first insulating layer which exposes the portion of the base substrate in the pixel area; and
a pixel electrode on the second insulating layer, in the pixel display area, the pixel electrode in the pixel display area overlapping the exposed portion of the base substrate in the pixel display area.

11. The display apparatus of claim 10, wherein
the semiconductor layer comprises an oxide semiconductor,
the first insulating layer comprises:
a first sub-insulating layer which is on the base substrate in the pixel non-display area and covers the gate electrode; and
a second sub-insulating layer on the first sub-insulating layer in the pixel non-display area, and
the second insulating layer comprises:
a third sub-insulating layer which is on the second sub-insulating layer and the base substrate, and covers the source electrode and the drain electrode; and
a fourth sub-insulating layer on the third sub-insulating layer.

12. The display apparatus of claim 10, further comprising:
a color filter on the second insulating layer in the pixel display area;
a third insulating layer on the color filter and the second insulating layer;
a common electrode on the third insulating layer, and a first opening defined in the common electrode;
a fourth insulating layer which is on the third insulating layer and covers the common electrode;
a first contact hole which is defined penetrating through the second, third and fourth insulating layers, and exposes a predetermined area of the drain electrode; and
a black matrix on the fourth insulating layer in the pixel non-display area,
wherein
the first opening is overlapped with the first contact hole, and the first opening has a size greater than a size of the first contact hole in a plan view, and
the pixel electrode is on the fourth insulating layer and connected to the drain electrode through the first contact hole.

13. The display apparatus of claim 12, further comprising:
a display area in which the plurality of pixels is arranged, and a non-display area adjacent to the display area;
a second contact hole defined penetrating through the first insulating layer in the non-display area;
a pad electrode on the base substrate in the non-display area;
a gate line connected to the gate electrode;
a data line connected to the source electrode; and
a connection electrode connected to the data line in the non-display area,
wherein
the first insulating layer is on the base substrate in the non-display area and covers the pad electrode, and
the data line extends to the non-display area and is connected to the pad electrode through the second contact hole defined penetrating through the first insulating layer.

14. The display apparatus of claim 13, further comprising:
a third contact hole defined penetrating through the second and fourth insulating layers and overlapping the second contact hole,
wherein
the second insulating layer is on the first insulating layer in the non-display area and covers the data line,
the fourth insulating layer is on the second insulating layer,
the connection electrode is connected to the data line through the third contact hole defined penetrating through the second and fourth insulating layers.

15. A thin film transistor substrate comprising:
a plurality of pixels, each pixel comprising:
a base substrate comprising a pixel display area, and a pixel non-display area surrounding the pixel display area;
a gate electrode on the base substrate in the pixel non-display area;
a first insulating layer which is on the base substrate in the pixel non-display area and covers the gate electrode;
a semiconductor layer on the first insulating layer, wherein a predetermined area of the semiconductor layer is overlapped with the gate electrode;
a source electrode and a drain electrode which are on the semiconductor layer and spaced apart from each other;

a second insulating layer which is on the first insulating layer and the base substrate, and covers the source electrode and the drain electrode;
a pixel electrode on the second insulating layer, in the pixel display area;
a color filter on the second insulating layer in the pixel display area;
a third insulating layer on the color filter and the second insulating layer;
a common electrode on the third insulating layer, and a first opening defined in the common electrode;
a fourth insulating layer which is on the third insulating layer and covers the common electrode;
a first contact hole which is defined penetrating through the second, third and fourth insulating layers and exposes a predetermined area of the drain electrode; and
a black matrix on the fourth insulating layer in the pixel non-display area,
wherein
the first opening is overlapped with the first contact hole, and the first opening has a size greater than a size of the first contact hole in a plan view, and
the pixel electrode is on the fourth insulating layer and connected to the drain electrode through the first contact hole.

* * * * *